(12) United States Patent
Kostamo et al.

(10) Patent No.: US 9,564,252 B2
(45) Date of Patent: Feb. 7, 2017

(54) METHOD AND ARRANGEMENT FOR MANUFACTURING A RADIATION WINDOW

(75) Inventors: Esa Kostamo, Helsinki (FI); Jari Kostamo, Helsinki (FI); Marco Mattila, Espoo (FI); Heikki Johannes Sipilä, Espoo (FI)

(73) Assignee: HS FOILS OY, Espoo (FI)

(*) Notice: Subject to any disclaimer, the term of this patent is extended or adjusted under 35 U.S.C. 154(b) by 0 days.

(21) Appl. No.: 14/377,345

(22) PCT Filed: Feb. 15, 2012

(86) PCT No.: PCT/FI2012/050149
§ 371 (c)(1),
(2), (4) Date: Oct. 8, 2014

(87) PCT Pub. No.: WO2013/121078
PCT Pub. Date: Aug. 22, 2013

(65) Prior Publication Data
US 2015/0053640 A1    Feb. 26, 2015

(51) Int. Cl.
*B29D 11/00* (2006.01)
*C03C 15/00* (2006.01)
(Continued)

(52) U.S. Cl.
CPC ............ *G21K 1/10* (2013.01); *B32B 37/24* (2013.01); *B32B 38/0004* (2013.01); *B32B 38/0008* (2013.01); *B32B 38/0012* (2013.01); *B32B 38/10* (2013.01); *B82Y 30/00* (2013.01); *H01J 5/18* (2013.01); *H01J 9/24* (2013.01);
(Continued)

(58) Field of Classification Search
None
See application file for complete search history.

(56) References Cited

U.S. PATENT DOCUMENTS

| 5,612,588 A | 3/1997 | Wakalopulos |
| 6,803,570 B1* | 10/2004 | Bryson, III .......... H01J 33/04 250/305 |

(Continued)

FOREIGN PATENT DOCUMENTS

| EP | 0476827 B1 | 11/1995 |
| EP | 1788605 | 5/2007 |

(Continued)

OTHER PUBLICATIONS

Perez-Rodriguez A et al, "Etch-stop behavior of buried layers formed by substoichiometric nitrogen ion implantation into silicon," Journal of the Electrochemical Society, vol. 143, No. 3, Mar. 1, 1996, pp. 1026-1033.

(Continued)

*Primary Examiner* — Stephanie Duclair
(74) *Attorney, Agent, or Firm* — Young & Thompson

(57) ABSTRACT

In a method for manufacturing a radiation window there is produced a layered structure where an etch stop layer exists between a carrier and a solid layer. A blank containing at least a part of each of the carrier, the etch stop layer, and the solid layer is attached to a radiation window frame. At least a part of what of the carrier was contained in the blank is removed, thus leaving a foil attached to the radiation window frame, wherein the foil contains at least a part of each of the etch stop layer and the solid layer.

15 Claims, 9 Drawing Sheets

(51) Int. Cl.
  C03C 25/68    (2006.01)
  C25F 3/00     (2006.01)
  H01L 21/302   (2006.01)
  H01L 21/461   (2006.01)
  G21K 1/10     (2006.01)
  H01L 21/311   (2006.01)
  B82Y 30/00    (2011.01)
  H01J 5/18     (2006.01)
  H01J 9/24     (2006.01)
  B32B 37/24    (2006.01)
  B32B 38/00    (2006.01)
  B32B 38/10    (2006.01)

(52) U.S. Cl.
  CPC .. *H01L 21/31116* (2013.01); *H01L 21/31144* (2013.01); *B32B 2037/243* (2013.01); *B32B 2037/246* (2013.01); *B32B 2307/40* (2013.01); *B32B 2310/0418* (2013.01); *B32B 2310/0463* (2013.01); *B32B 2310/0881* (2013.01); *B32B 2310/0887* (2013.01); *B32B 2551/00* (2013.01)

(56) References Cited

U.S. PATENT DOCUMENTS

| | | | |
|---|---|---|---|
| 7,618,906 | B2 | 11/2009 | Meilahti |
| 8,494,119 | B2 | 7/2013 | Andersson |
| 2007/0111617 | A1* | 5/2007 | Meilahti ............ H01J 5/18 442/1 |
| 2008/0317209 | A1 | 12/2008 | Sipila et al. |
| 2011/0200787 | A1 | 8/2011 | Regan et al. |
| 2011/0311029 | A1* | 12/2011 | Andersson ......... H01J 5/18 378/161 |

FOREIGN PATENT DOCUMENTS

| | | | |
|---|---|---|---|
| EP | 2402975 | | 1/2012 |
| JP | 3053200 | A1 | 3/1991 |
| WO | 96-21238 | | 7/1996 |
| WO | 9803353 | A1 | 1/1998 |
| WO | 2009/071587 | * | 6/2009 |
| WO | 2011-151505 | * | 12/2011 |
| WO | 2011151505 | A1 | 12/2011 |
| WO | 2011151506 | A1 | 12/2011 |

OTHER PUBLICATIONS

Supplementary European search report, dated Sep. 9, 2015; Application No. 12 86 8781.

International Search Report, dated May 6, 2013, from corresponding PCT application.

* cited by examiner

FROM PREPARATION OF CARRIER

TO CUTTING INTO BLANK

METHOD AND ARRANGEMENT FOR MANUFACTURING A RADIATION WINDOW

TECHNICAL FIELD

The invention concerns generally the technology of thin foils that are used as such or as a part of a radiation window in a measurement apparatus. Especially the invention concerns a method for manufacturing a window foil, which can have an etch stop layer and/or insulator layer next to a crystalline layer as a part of its structure.

BACKGROUND OF THE INVENTION

A radiation window is a part of a measurement apparatus that allows a desired part of electromagnetic radiation to pass through. In many cases the radiation window must nevertheless be gastight, in order to seal and protect an enclosure where reduced pressure and/or a particular gas contents prevail. The pressure inside the enclosure may be also higher than outside, for example in measurement apparata on board space-going platforms. In order to cause as little absorption as possible of the desired radiation, a major part of the radiation window should consist of a very thin foil.

Patent applications number PCT/FI2010/050781 (published as WO2011/151505) and PCT/FI2011/050100 (published as WO2011/151506) disclose a manufacturing principle, according to which a silicon wafer or a corresponding piece of etchable material is used as a temporary carrier during the manufacturing process of a radiation window. A so-called etch stop layer is produced on a polished surface of the temporary carrier. The etch stop layer is meant to eventually remain as a part of the completed radiation window. Further layers of the radiation window are produced on the etch stop layer using thin film manufacturing techniques, such as CVD (chemical vapour deposition), ALD (atomic layer deposition), and/or PLD (pulsed laser deposition). After the completion of adding layers, window blanks are cut out, with the temporary carrier still present giving additional support and enabling easier handling. A window blank is attached to a frame, after which the exposed temporary carrier is not needed any more and can be etched away. The etching is conveniently stopped by the etch stop layer, leaving only the layered radiation window foil attached in the frame. The result is a completed radiation window, the frame of which can be used for attaching it into place in a measurement apparatus.

Despite its many advantages, the manufacturing method described above still leaves room for finding other advantageous methods for manufacturing radiation window foils and radiation windows.

SUMMARY OF THE INVENTION

According to an aspect of the invention, a method and an arrangement are provided that enable manufacturing very thin radiation windows and radiation window foils where good mechanical strength combines with small undesired attenuation of radiation and relative ease of manufacturing. According to another aspect of the invention, a method and an arrangement are provided that enable manufacturing radiation windows with a good yield.

The objectives of the invention are achieved by using an etchable carrier, forming an etch stop layer on a surface or at a depth from a surface of the etchable carrier, and using a solid material layer on top of the etch stop layer, or a part of said solid material layer, as a structural layer of the future radiation window.

A method according to the invention is characterised by the features of the characterising part of the independent claim directed to a method.

The invention applies also to an arrangement, the characteristic features of which are described in the characterising part of the respective independent claim.

According to an aspect of the invention, what is known as the SOI (silicon on insulator) technology in the technical field of manufacturing integrated circuits offers significant possibilities also for manufacturing radiation window films and radiation windows. A feature common to the SOI manufacturing methods meant here is the production of a layered structure, in which an insulator layer is sandwiched between two solid layers. Following the notation "SOI", in most manufacturing methods that the semiconductor industry uses for this purpose, at least one of said solid layers consists of silicon. In many cases the silicon layer is monocrystalline.

In a layered structure of the kind described above it is possible to keep one of the solid layers relatively thick, so that it offers good mechanical support as a carrier, while the other solid layer on the other side of the insulator layer can be thinned and/or patterned in a desired way. The layered structure or a cut-out part of it may be attached to a radiation window frame, after which the carrier or a desired part of it may be removed. The insulator layer typically has good resistance to etching agents that etch away the basic carrier material, so etching is a preferably way of removing the (desired portion of the) carrier. As a result, a foil is left attached to the radiation window frame. The foil contains at least a part of both the insulator (i.e. etch stop) layer and the solid layer on its other side.

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

The exemplary embodiments of the invention presented in this patent application are not to be interpreted to pose limitations to the applicability of the appended claims. The verb "to comprise" is used in this patent application as an open limitation that does not exclude the existence of also unrecited features. The features recited in depending claims are mutually freely combinable unless otherwise explicitly stated.

DETAILED DESCRIPTION OF THE INVENTION AND ITS EMBODIMENTS

In this description we use the following vocabulary. A layer means a quantity of essentially homogeneous material that by its form has much larger dimensions in two mutually orthogonal directions than in the third orthogonal direction. In most cases of interest to the present invention, the dimension of a layer in said third orthogonal direction (also referred to as the thickness of the layer) should be constant, meaning that the layer has uniform thickness. A foil is a structure, the form of which may be characterised in the same way as that of a layer (i.e. much larger dimensions in two mutually orthogonal directions than in the third orthogonal direction) but which is not necessarily homogeneous: for example, a foil may consist of two or more layers placed and/or attached together. A mesh is a special case of a layer or foil, in which the constituents do not make up a continuous piece of material but define an array of (typically regular, and regularly spaced) openings. A radiation window foil is a foil that has suitable characteristics (low absorption, sufficient gastightness, sufficient mechanical strength etc.) for use in a radiation window of a measurement apparatus. A radiation window is an entity the comprises a piece of radiation window foil attached to a (typically annular) support structure or frame so that electromagnetic radiation may pass through an opening defined by the support structure without having to penetrate anything else than said piece of radiation window foil and the (typically gaseous) medium that otherwise exists within said opening.

Figure 1:
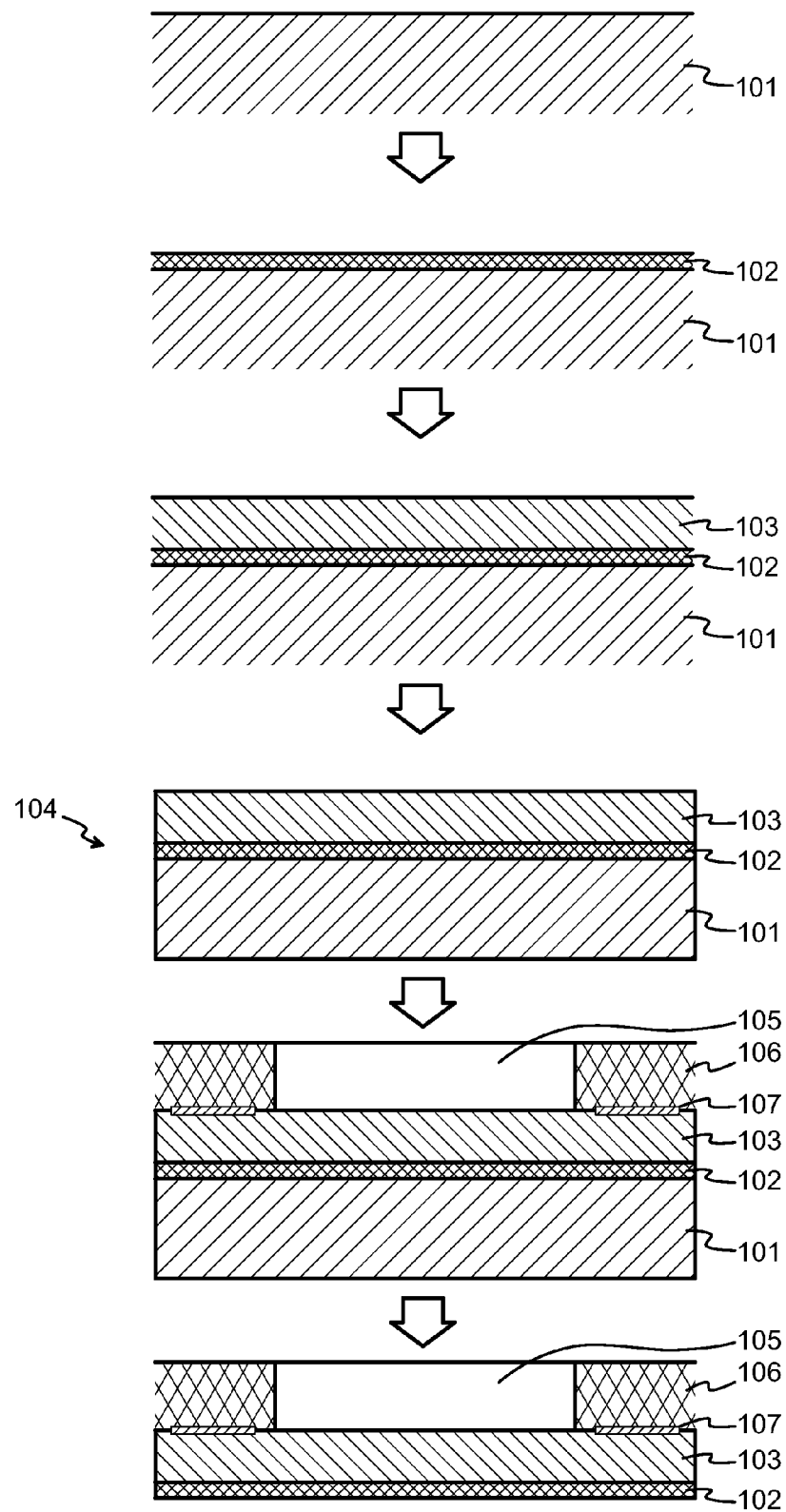
FIG. 1 illustrates a method for manufacturing a radiation window.

FIG. 1 illustrates a method according to an embodiment of the invention by showing how a radiation window is gradually formed as a series of steps. The topmost step illustrates a solid carrier 101, at least one surface of which has been polished. In FIG. 1, the polished surface faces upwards. The required smoothness of the polished surface is determined by the aim of covering it with an essentially continuous etch stop layer with uniform thickness in the order of 10 to 1000 nanometers. As an example, silicon wafers are routinely polished to achieve rms (root mean square) roughness values in the order of fractions of a nanometer, which is a sufficient for the purposes of the present invention. In addition or as alternative to silicon, the carrier 101 may be manufactured from some other solid material that is etchable with some reasonably common and easily handled etching agent and that can be polished to the required level of smoothness.

In the next step an etch stop layer 102 is produced on the polished surface of the carrier 101. The main objective of the etch stop layer 102 is to keep an etching agent, which in a later process step will appear from the side of the carrier and remove the carrier 101, from affecting those layers that will come on the other side of the etch stop layer 102. Therefore the material for the etch stop layer 102 should be selected so that it will not be affected to any significant degree by an etching agent that works effectively on the material of the carrier 101. Additionally the material of the etch stop layer 102 should be applicable for deposition in thin layers (in the order of 10 to 1000 nanometers; however typically less than 200 nanometers at most), and it should neither significantly absorb radiation nor produce any awkwardly handled anomalies at the wavelengths of electromagnetic radiation at which the radiation window is to be used. Further advantageous characteristics of an etch stop layer include corrosion resistance against environmental conditions during the use of an X-ray measurement apparatus, and good adhesion properties for further layers to be deposited thereon.

If the carrier 101 is made of silicon, one advantageous material for the etch stop layer 102 is silicon nitride, which is also a common insulator material used in manufacturing 501 wafers. Silicon oxide can be used to make the etch stop layer, although its resistance to etching agents (such as potassium hydroxide) used to etch silicon is not as good as that of silicon nitride. As an alternative, if the carrier 101 is made of e.g. some metal that will be etched with an acid, an advantageous material for the etch stop layer 102 is titanium oxide which is known to have good resistance against may acids that eat their way through metals and metallic alloys.

The deposition of the etch stop layer 102 should take place as uniformly as possible, especially avoiding any remaining pinholes in the etch stop layer. Suitable methods for depositing the etch stop layer 102 include, but are not limited to, chemical vapour deposition and pulsed laser deposition.

The next step of the method illustrated in FIG. 1 involves bonding a solid layer 103 on the etch stop layer 102, thus producing a layered structure where said etch stop layer 102 exists between said carrier 101 and said solid layer 103. It should be naturally noted that directional references like "on top" refer in this description only to the way of graphical illustration selected for the present drawings, and they are not limiting features of embodiments of the invention. As a difference to e.g. the patent applications number PCT/FI2010/050781 and PCT/FI2011/050100 mentioned earlier, the expression "bonding a solid layer" means that said layer exists in solid, layer-like form before it comes into contact with the etch stop layer 102.

From the technology of manufacturing SOI wafers for the production of semiconductor components it is known to produce a layered structure by placing a highly polished silicon wafer against another, on the surface of which an insulator layer has been produced. Similar technology can be applied here. The surfaces that come against each other (in FIG. 1, the upper surface of the etch stop layer 102 and the lower surface of the solid layer 103) must be very clean and very even. In the production of SOI wafers these criteria are routinely met by using careful polishing techniques and handling the silicon wafers in a cleanroom environment. At a temperature that can be close to normal room temperature, the etch-stop-layer-covered carrier and the solid layer 103 are pressed gently against each other, which causes them to be bonded together through the van der Waals force. The strength of the bonding can be enhanced by subsequently increasing the temperature of the layered structure to a couple of hundreds of degrees centigrade.

The requirement that the solid layer 103 exists in solid, layer-like form before it comes into contact with the etch stop layer 102 sets certain minimum thickness requirements to the solid layer 103, although such minimum thickness requirements naturally depend on the technology that is used to produce and handle the solid layer 103 before bonding it to the etch-stop-layer-covered carrier. In semiconductor component manufacturing processes the thicknesses of wafers are in the order of several hundreds of micrometers: for example silicon wafers typically come in thicknesses from the 275 micrometers used for 2-inch wafers to the 925 micrometers that is expected to be a standard thickness of the future 450 millimeter wafers. Thicknesses of wafers aimed for photovoltaic components are typically in the order of 200-300 micrometers. The solid layer 103 may be monocrystalline, especially if it comes from a manufacturing process that was originally aimed at producing wafers for the production of semiconductor components.

After successful bonding to the etch-stop-layer-covered carrier the solid layer 103 does not need to be as thick any more, because it is mechanically supported by the etch-stop-layer-covered carrier to which it is bonded. Neither does the solid layer 103 need to be continuous or have constant thickness. Therefore the method may comprise thinning the solid layer 103 into a predetermined thickness and/or patterning the solid layer 103 with a predetermined pattern of differences in thickness. For example, after bonding to the etch-stop-layer-covered carrier, the solid layer 103 can be first thinned to a thickness in the order of some tens of micrometers, like 15 micrometers, and/or made to have the appearance of a mesh or grid with regular and regularly spaced openings. For thinning, known methods again exist from the manufacturing of SOI wafers. These methods may include at least one of grinding, etching, and polishing. If patterning is made, suitable methods include but are not limited to photolithography, wet etching, dry etching, plasma etching, electron beam lithography, and ion beam lithography. The thinning and/or patterning methods should naturally be selected so that they still leave the etch stop layer 102 continuous.

It should be noted that after the bonding of the solid layer 103 to the etch-stop-layer-covered carrier 101, and before any thinning and/or patterning is made, the structure may exhibit significant symmetry (depending on the original thicknesses of the carrier 101 and the solid layer 103). Therefore a possibility exists to switch the roles of the carrier and the solid layer in the continuation; for example the layer to be subsequently thinned and/or patterned may be the one that first received the etch stop layer on its surface. The designations "carrier" and "solid layer" are just names that are used in this description to illustrate the role of certain layers in a particular embodiment of the invention. In order to maintain the clarity of the description we will consistently assume here that a "carrier" is the part of the layered structure that eventually will be removed (completely, or at least to a very large extent), and the "solid layer" is the part of the layered structure that eventually will remain (at least in some form, like a thinned and patterned form) as a part of the completed radiation window. These designations apply irrespective of which of them first received the etch stop layer on its surface.

The next step in FIG. 1 illustrates taking a blank 104, which contains at least a part of each of said carrier 101, etch stop layer 102, and solid layer 103. In an extreme case the blank 104 could consist of the whole of the carrier 101, etch stop layer 102, and solid layer 103. However, since radiation windows are frequently much smaller than the wafer sizes known from semiconductor manufacturing, which advantageously form a basis for the method illustrated so far, it is more probable that the blank 104 is cut out from the layered structure described above. Manufacturers of semiconductor components apply so-called dicing to cut out individual chips from a wafer, and similar methods can be applied to cut out several blanks from a common layered structure.

As an example, the layered structure might have originally been a SOI wafer with a diameter of several inches, while the diameter of a blank sufficient for a radiation window may be between 1 and 2 centimeters. On the other hand the invention does not limit the maximum size of a radiation window to be made. As another example, a radiation window according to an embodiment might have 50 millimeters as the diameter of the foil-covered opening for the radiation to pass through. Cutting the combined structure into blanks at this step of the method is not an essential requirement of the invention, but it is advantageous in the sense that a larger number of completed radiation windows can be very practically manufactured from a single original workpiece.

In the next step of FIG. 1 the blank 104 is attached to a radiation window frame. In particular, the blank is attached to an annular region around an opening 105 in a support structure 106, here with the solid layer 103 facing the support structure 106. For the attachment for example gluing or soldering can be used; the cross-section of an exaggeratedly thick layer of glue or solder 107 is schematically shown in FIG. 1. Also otherwise we may note that the illustrated dimensions are not to scale and not comparable to each other; they have been selected only for graphical clarity in the drawings. The fact that the carrier 101 is still present at the step of attaching those parts to the support structure that eventually will constitute the radiation window foil means that handling is easy and there is no need to worry about wrinkling or other kinds of deformation of the radiation window foil at this stage. The illustration of the glue or solder 107 is only schematic in FIG. 1, and it does not mean that a flat layer of glue or solder on the planar surface between the support structure 106 and the solid layer 103 would be the only possible alternative.

The descriptor "annular" should be understood in a wide sense. The invention does not require the support structure to have e.g. a circular form. It is sufficient that the support structure offers some edges and/or a region around the opening, to which the radiation window foil can be attached tightly and extensively enough to keep the radiation window foil in the completed structure securely in place, and—in those applications where gastightness is required—to form a gastight seal.

In the last step illustrated in FIG. 1 the carrier 101 has been etched away, leaving only a radiation window foil comprising the etch stop layer 102 and the beryllium layer 103 to cover the opening 105 in the support structure 106. This phase of the method underlines the denomination of the etch stop layer 103. Etching is considered to be the most advantageous way of carefully removing at least a part of what of said carrier was contained in said blank, thus leaving a foil attached to said radiation window frame, wherein said foil contains at least a part of each of said etch stop layer and said solid layer. As an example, if the carrier 101 is made of silicon and the etch stop layer 102 is made of silicon nitride, potassium hydroxide (KOH) is one suitable etching agent, especially at a slightly elevated temperature like 70 degrees centigrade. In the etching stage it should be ensured that the etching agent only affects the side of the radiation window foil where the etch stop layer 102 exists. In doing so the support structure 106 can be utilized: for example, one may turn the structure so that the carrier faces upwards, and attach one end of a tubular shield to outer edges of the support structure 106, so that a "cup" is formed with the carrier-covered radiation window foil forming the bottom of the cup. The tubular shield will keep the etching agent poured into the cup from affecting other parts of the structure than the carrier.

After etching away the carrier, post-processing steps such as rinsing, drying, and testing may be applied according to need.

Figure 2:
FIG. 2 illustrates a part of a method for manufacturing a radiation window.
Figure 2:
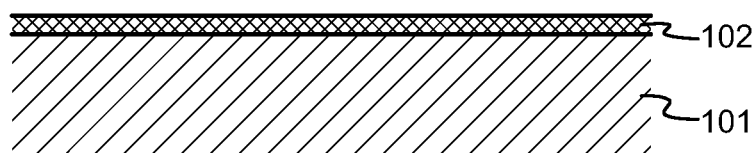
Figure 2:
Figure 2:
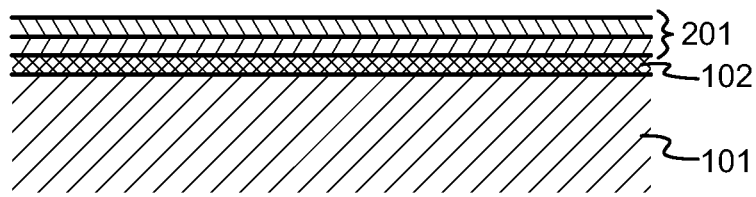
Figure 2:
Figure 2:
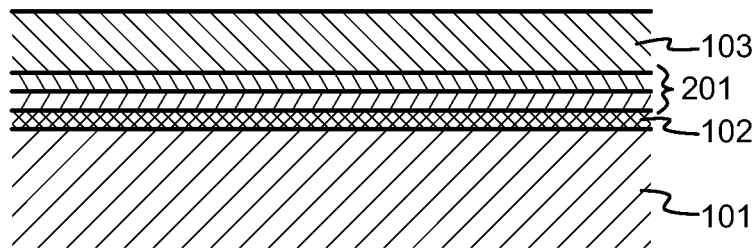
Figure 2:

FIG. 2 illustrates an optional addition to the basic method described above in association with FIG. 1. In the topmost illustrated step of FIG. 2, the etch stop layer 102 has been produced on a polished surface of the carrier 101. As the next step in FIG. 2 one or more diffusion barrier layers are produced on the etch stop layer 102. Together the one or more diffusion barrier layers constitute a layered diffusion barrier 201. One possible layered diffusion barrier of this kind is the so-called layered superbarrier, which consists of alternating aluminium oxide ($Al_2O_3$) and titanium oxide ($TiO_2$) layers. For example, in the middle step illustrated in FIG. 2 the formation of a layered diffusion barrier 201 may begin by depositing a 5 nanometers layer of titanium oxide, followed by a 20 nanometers layer of aluminium oxide, after which these deposition steps are repeated one after the other until the total thickness of the layered diffusion barrier 201 is in the order of 100 nanometers. This example is by no means limiting, and several other approaches may also be taken to produce the layered diffusion barrier 201. Any deposition method can be used; for example atomic layer deposition has been reported to work well in the production of this kinds of layered structures.

The lowest step illustrated in FIG. 2 represents bonding a solid layer 103 on said etch stop layer (which in this case has additionally the layered diffusion barrier 201 therebetween), thus producing a layered structure where the etch stop layer 102 exists between the carrier 101 and (the layered diffusion barrier 201 and) the solid layer 103. Although there is now the layered diffusion barrier 201 in between, the solid layer 103 is still on an opposite side of the etch stop layer 102 than the carrier 101, which is important taken that the carrier 101 should later be removed in an etching process the effect of which should end at the etch stop layer 102. From this step the method of manufacturing a radiation window continues to cutting the radiation window foil into blank(s) for radiation window(s), like in the fourth step of FIG. 1. Also here it should be noted that the roles of the solid layer and the carrier can be switched.

Figure 3:
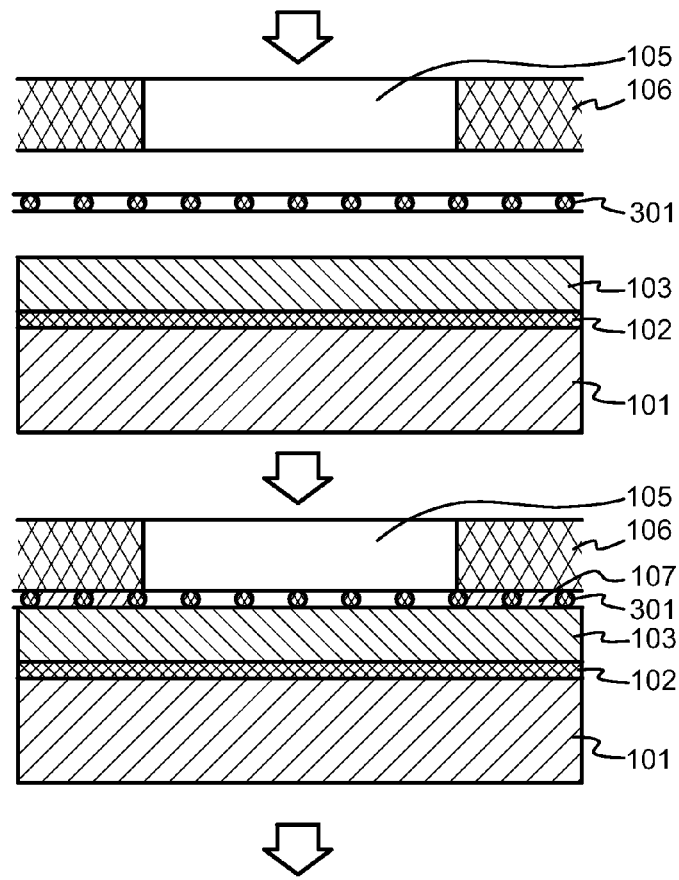
FIG. 3 illustrates another part of a method for manufacturing a radiation window.

FIG. 3 illustrates another optional addition to the methods described above. The embodiment of FIG. 3 is here shown combined with the embodiment of FIG. 1, i.e. without a layered diffusion barrier, but it could quite as well be combined with the embodiment of FIG. 2 so that the layered diffusion barrier would be included.

After the combined structure comprising the carrier, the etch stop layer, and the solid layer has been cut into a blank, it becomes actual to attach it to an annular region around an opening in a support structure. In the upper step illustrated in FIG. 3 a reinforcement mesh 301 is placed therebetween, so that after attaching the reinforcement mesh 301 remains sandwiched between the support structure 106 and the layered window foil at said annular region, and stretches across the opening 105 together with the layered window foil. The same glue or solder 107 can be used to attach all components together; alternatively or additionally the reinforcement mesh 301 can be first separately glued, soldered, or otherwise attached to one of the support structure 106 or the blank comprising the carrier, the etch stop layer, and the solid layer.

After the attaching the process continues to etching away the remaining carrier. Using a reinforcement mesh is particularly advantageous if the radiation window will separate spaces with a large pressure difference therebetween, and/or if enhanced mechanical strength is otherwise desired, and/or if the beryllium layer is very thin.

It is possible to attach the reinforcement mesh to the radiation window foil by using a positive-working photosensitive glue, as explained in U.S. Pat. No. 7,618,906, prior to attaching the blank to the support structure. The use of positive-working photosensitive glue has the inherent advantage that the reinforcement mesh can itself act as the mask that is needed to ensure proper curing of the glue at only desired locations. It will keep the reinforcement mesh attached to the completed radiation window foil also throughout the opening in the support structure, which reduces the unwanted mechanical wear that the reinforcement mesh could otherwise cause to the foil.

It is also possible to use a reinforcement mesh on that side of the completed radiation window foil that has the etch stop layer. It should be noted that the thickness of the radiation window foil in relation to the diameter of the opening 105 has been widely exaggerated in the drawings; in practice the opening may have a diameter of several millimeters (even tens of millimeters), while the overall thickness of the radiation window foil is only some micrometers. Therefore a possible reinforcement mesh on the etch stop layer side would not need to bulge significantly from the surface of the support structure 106 where its edges would be attached.

Figure 4:
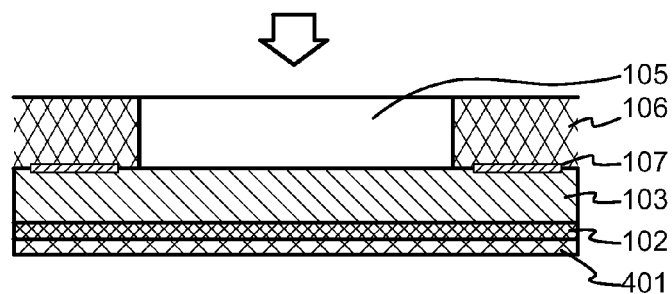
FIG. 4 illustrates another part of a method for manufacturing a radiation window.

FIG. 4 illustrates yet another optional addition that can be added to any of the methods described above. According to FIG. 4, after etching away the carrier, there is produced one or more additional layers 401 on the exposed etch stop layer 102. For example, if the solid layer 103 that has been described so far is called a first solid layer, the radiation window may comprise a second solid layer as the additional layer 401 on an opposite side of the etch stop layer 102 than said first solid layer 103. Using a second solid layer may be advantageous especially if it is possible that the first solid layer 103 may contain pinholes. The additional layer 401 may also be an aluminium layer, which would have a role in blocking out unwanted wavelengths of electromagnetic radiation, such as visible light. An aluminium layer and/or other layers could also be produced on that side of the first solid layer 103 that will face the support structure 106, before making the attachment.

Figure 5:
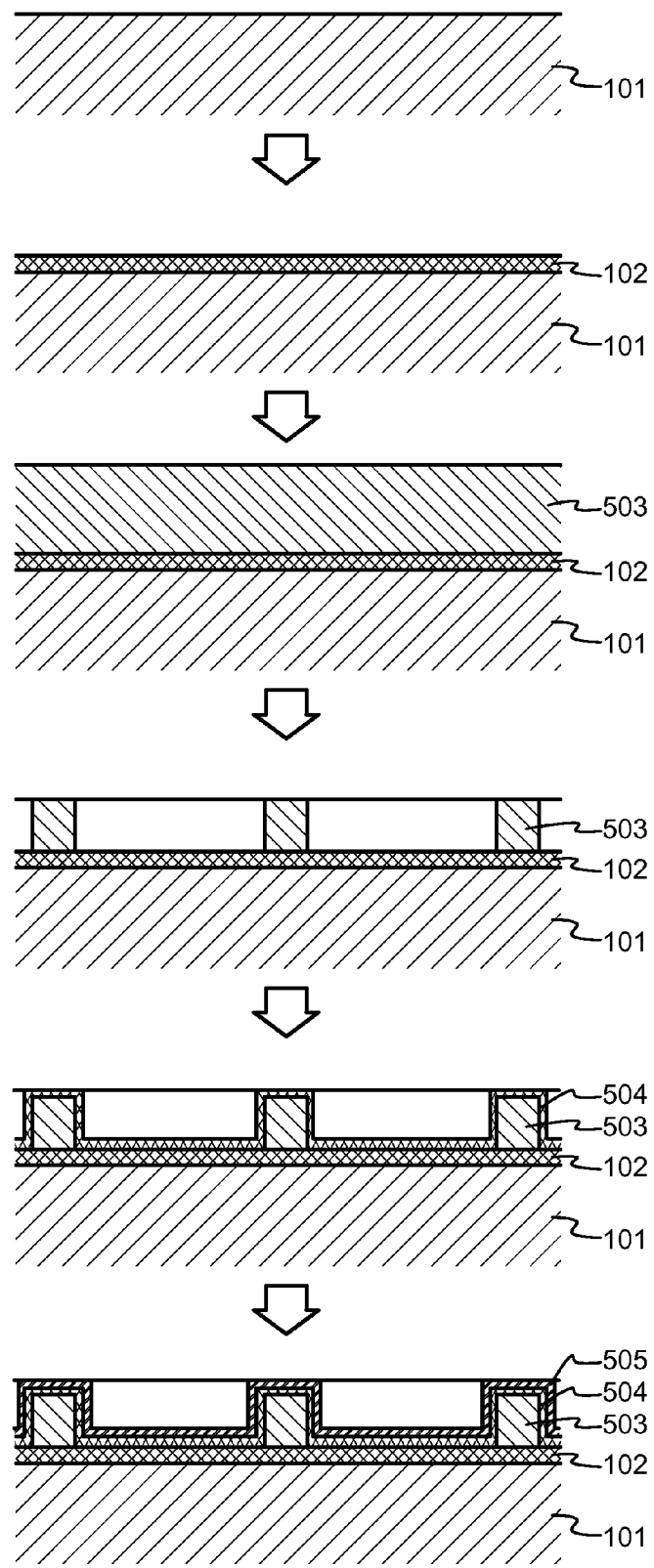
FIG. 5 illustrates another part of a method for manufacturing a radiation window.

FIG. 5 illustrates a first part of a radiation window manufacturing method according to yet another embodiment of the invention. The two topmost steps are comparable to corresponding steps in FIG. 1 earlier. Thus the topmost step illustrates a carrier 101, at least one surface of which has been polished and faces upwards. The required smoothness is evaluated by the same criterion as earlier, i.e. the aim of covering it with an essentially continuous etch stop layer with uniform thickness in the order of 10 to 200 nanometers or even up to 1000 nanometers. Again, a silicon wafer is a good example, but the carrier 101 may be made of some other solid material that is etchable with some reasonably common and easily handled etching agent and that can be polished to the required level of smoothness.

An etch stop layer 102 is produced on the polished surface of the carrier 101. The main objective of the etch stop layer 102 is to keep an etching agent, which in a later process step will appear from below and remove the carrier 101, from affecting those layers that come on top of the etch stop layer 102. Therefore the material for the etch stop layer 102 should be selected so that it will not be affected to any significant degree by an etching agent that works effectively on the material of the carrier 101. Additionally the material of the etch stop layer 102 should be applicable for deposition in thin layers (in the order of 10 to 200 nanometers), and it should neither significantly absorb radiation nor produce any awkwardly handled anomalies at the wavelengths of electromagnetic radiation at which the radiation window is to be used. Further advantageous characteristics of an etch stop layer include corrosion resistance against environmental conditions during the use of an X-ray measurement apparatus, and good adhesion properties for further layers to be deposited thereon. If the carrier 101 is made of silicon, advantageous material for the etch stop layer 102 include but are not limited to silicon nitride and silicon oxide. The deposition of the etch stop layer 102 should take place as uniformly as possible, especially avoiding any remaining pinholes in the etch stop layer. Suitable methods for depositing the etch stop layer 102 include, but are not limited to, chemical vapour deposition and pulsed laser deposition.

At the third step of FIG. 5, a solid layer 503 is bonded on the etch stop layer 102. At first, the solid layer 503 is uniform. It can consist of e.g. a polished monocrystalline silicon wafer with a thickness of some hundreds of micrometers. Also other materials could be used. The criteria to be applied in choosing the material for the solid layer 503 include reasonable mechanical strength, good binding to the etch stop layer 102, suitability to etching with an etching method and/or agent that does not affect the etch stop layer 102 to a significant extent, low absorption of radiation, absence of disturbing fluorescence peaks and/or other awkwardly handled anomalies at the wavelengths of electromagnetic radiation at which the radiation window is to be used, as well as easy handling in a manufacturing process. For example beryllium has all other desired characteristics but does not meet the last criterion in full because of its toxicity. Silicon on the other hand fulfils all criteria listed above; especially monocrystalline silicon has mechanical properties that appear to top those of multi- or polycrystalline silicon.

The following step in the method of FIG. 5 can be included, if the etch stop layer is uniform enough to alone constitute the basic continuous layer of the radiation window foil. Namely, in the fourth step from above in FIG. 5, the solid layer 503 is first thinned into a predetermined thickness and then patterned with a predetermined pattern of differences in thickness. In particular, regularly spaced portions of the originally uniform solid layer 503 are removed to turn said uniform layer into a mesh. The characteristic dimensions of the mesh may include for example a diameter of openings in the order of 20 to 200 micrometers, and a width of the ribs in the mesh in the order of 5 to 20 micrometers. The height (the dimension in the vertical direction in FIG. 5) of the ribs constituting the mesh will be essentially the same as the thickness of the solid layer after thinning, and it can be for example in the order of 15 micrometers. These dimensions are examples only, and the eventual selection of characteristic dimensions should be made in accordance with the mechanical strength that the completed radiation window should have. Several methods for turning a previously uniform, thin-film-deposited layer into a mesh layer are known, including but not being limited to photolithography, wet etching, dry etching, plasma etching, electron beam lithography, and ion beam lithography. The method should naturally be selected so that it still leaves the etch stop layer 102 continuous.

If the roles of the carrier and the solid layer are to be switched in the embodiment of FIG. 5, this should be done before the thinning and patterning of what then becomes the solid layer in the vocabulary used in this description.

As an alternative to openings that cut all the way through the solid layer, the fourth step from above in FIG. 5 can also comprise reflectively removing from the solid layer an array of portions that are smaller in height than the total thickness of the (possibly thinned) solid layer. This alternative can be used especially if it is possible that the etch stop layer is not uniform enough or not strong enough to alone constitute the basic continuous layer of the radiation window foil. Selectively removing said array of portions will leave intact a thin continuous part of the solid layer closest to the etch stop layer, which means that the etch stop layer and said thin continuous part of the solid layer will together constitute the basic continuous layer of the radiation window foil.

The next step illustrated in FIG. 5 is optional and can be included if it is desirable to have an additional diffusion barrier in the radiation window foil. A conformal diffusion barrier layer 504 is formed on top of the mesh that remains of the solid layer 503. The method for producing the diffusion barrier layer 504 can be selected freely, as long as the result is a reasonably smooth, conformal, and thin layer of appropriate materials. As an example, atomic layer deposition may be used to produce a diffusion barrier layer that consists of five to ten alternating layers of aluminium oxide $Al_2O_3$ and titanium oxide $TiO_2$. Exemplary layer thicknesses could be 5 to 10 nanometers for the former and 2 to 5 nanometers for the latter.

Similarly the last step illustrated in FIG. 5 is optional and can be included if it is desirable to have a visible light blocking layer in the radiation window foil. The most typical material used for a visible light blocking layer is aluminium with a layer thickness of 30 to 100 nanometers. Also a beryllium layer of 100 to 400 nanometers could be used, or any other material and layer thickness that attaches well to the previous layer and fulfils the task of blocking visible light without causing other effects that would interfere with the radiation measurement for which the radiation window is made.

The third and fourth steps in FIG. 5 may be commonly referred to as the mesh-making step. The two last steps (producing a diffusion barrier and producing the visible light blocking layer) and the mesh-making step could basically be per-formed in any mutual order, but it should be noted that a diffusion barrier layer or a visible light blocking layer also offers a reasonably good protection against corrosion, for which reason it is advisable to have one of these two layers as the topmost layer after performing the steps illustrated in FIG. 5. At least one of the diffusion barrier or the visible light blocking layer could also be produced later in the process and at a different side of the radiation window foil, as will be described later.

Figure 6:
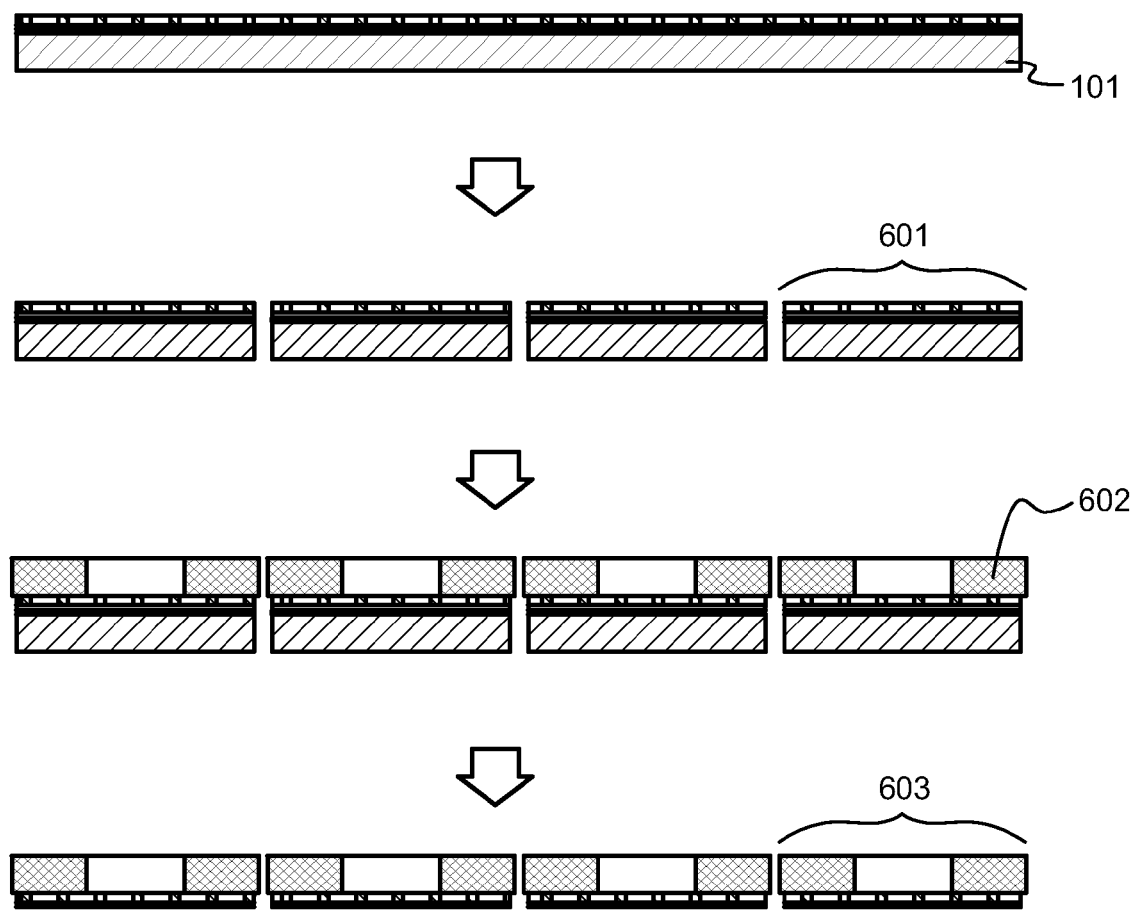
FIG. 6 illustrates another part of a method for manufacturing a radiation window.

In FIG. 6 the starting point is the same at which the first part of the method ended in FIG. 5: on top of a carrier 101 (such as a 6-inch silicon wafer, for example) there exist layers, of which the mesh layer is most clearly visible due to the visible cross sections of the mesh ribs (although also in this drawing the dimensions have only be selected for graphical clarity and are not in scale). In the next step the carrier with the layers on its surface is cut into blanks, of which blank 601 is an example. The size of the blanks is selected so that a blank covers an annular opening defined by a support structure, and additionally extends onto the solid surface of the support structure around said annular opening. The reason for this dimensioning becomes apparent in the third step of FIG. 6, where each blank is glued, soldered, welded or otherwise attached to a radiation window frame or support structure. Of these, support structure 602 is shown as an example. The attachment to the support structure is preferably made on that side of the cut blank that comprises the layers; in other words, the etch stop layer, the solid layer from which a mesh has been made, and the possible diffusion barrier and visible light blocking layers all become sandwiched between the support structure and the carrier.

The last step in FIG. 6 shows removing the carrier, which is most advantageously done by etching. If the carrier was originally a silicon wafer, an easily applicable method for removing the carrier is etching in a hot potassium hydroxide (KOH) solution. The etch stop layer keeps the etching agent from affecting the remaining layers of the radiation window foil. Even if some of them would be slightly affected at the very edge of the piece of radiation window foil that remains attached to the support structure, the porous nature of the mesh layer tends to slow down the propagation of the etching reaction in the direction that is horizontal in FIG. 6, which means that effects of the etching to the remaining radiation window foil remain negligible. The result is a completed radiation window, illustrated with the reference designator 603.

Above it was noted that at least one of the diffusion barrier or the visible light blocking layer could also be produced later in the process than what was explained earlier. At least one of them, or even both in succession, could be produced on the surface of the etch stop layer that was exposed by etching away the carrier. However, making the diffusion barrier and the visible light blocking layer earlier in the process may be more advantageous, because up to the cutting of the carrier the process can typically be conducted within a single clean room with virtually no exposure at all to dust or impurities. Keeping the produced layers very pure and free of contaminants, up to a level that is difficult to achieve otherwise than within confinement to clean room, is advantageous because it helps to avoid spurious fluorescence and other unwanted effects when the radiation window is later used in a measurement apparatus.

As with the case of using e.g. positive-working photosensitive polymer as a glue, which was explained earlier in this description, the method of FIGS. 5 and 6 involves the inherent advantage that each and every rib of a reinforcement mesh is and remains fixedly attached to the continuous part of the radiation window foil. Consequently the radiation window foil exhibits significant mechanical strength irrespective of the sign of the pressure difference across the radiation window. The mechanical strength of the mesh is even better if the solid layer was originally monocrystalline, like a monocrystalline silicon wafer. Additionally all microscopic movements of the mesh relative to the continuous part of the radiation window foil are excluded, which removes the risk of mechanical wear therebetween. These are significant differences to e.g. the radiation windows described in the prior art publication US 2008/0296518 A1, in which the continuous part of the radiation window foil is a separate (typically polymer) film that is just laid across the top surface of a support mesh. It should be noted that the author of said reference document specifically emphasizes the corresponding drawbacks by pointing out the significance of rounding and smoothing the upper edges of the ribs.

Figure 7:
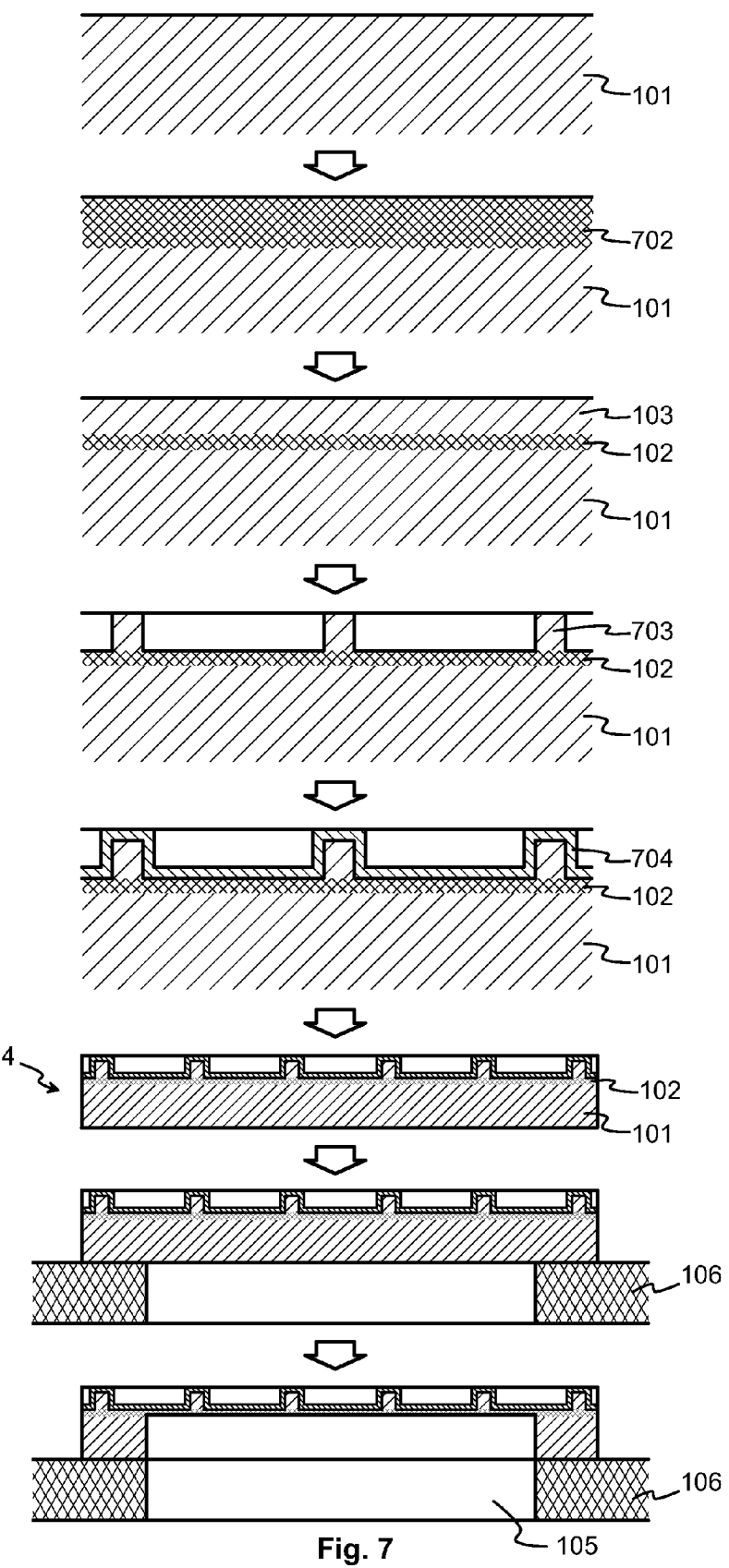
FIG. 7 illustrates another method for manufacturing a radiation window.

FIG. 7 illustrates a method for manufacturing a radiation window, including some variations to the previously disclosed embodiments. At the topmost step a solid carrier 101 is provided. The solid carrier may be for example a disc of intrinsic crystalline semiconductor material, like monocrystalline silicon. One surface of the solid carrier 101 is subjected to intensive ion beam implantation with e.g. oxygen or nitrogen ions. The second step shows how the ion beam implantation results in an ion-implanted layer 702 on one surface of the carrier 101. Subsequent high temperature annealing produces the layered structure illustrated in the third step of FIG. 7, in which a solid layer 103 exists on top an etch stop layer 102 that remains from the ion-implanted layer. Thus the three topmost steps in FIG. 7 can be characterised as creating an etch stop layer 103 inside of what was originally a solid carrier 101. A corresponding way of creating an internal oxide layer is known from the so-called SIMOX (separation by implantation of oxygen) process that is used to produce SOI wafers.

The solid layer 103 that remains on top of the etch stop layer 102 in the third step of FIG. 7 is usually relatively thin compared to e.g. a solid layer obtained by bonding two wafers together. However, it can be thinned by e.g. grinding, etching, and/or polishing if necessary. The fourth step in FIG. 7 illustrates patterning the solid layer with a predetermined pattern of differences in thickness, which turns the solid layer into mesh that consists of ribs 703. Next there is illustrated a step of depositing a further layer 704 or layers to conformally cover the mesh and the bottoms of its openings, where the etch stop layer 102 may have been exposed when the mesh was made.

In the next step a blank 104 is produced; typically a larger wafer or corresponding workpiece is cut into a number of blanks. The drawing scale of FIG. 7 is slightly changed here to emphasize the fact that a blank typically has much larger horizontal dimensions than the mesh. In general FIG. 7 is not to scale, e.g. because the vertical dimensions must be heavily exaggerated in order to represent them in an explanatory drawing. As a result of the cutting, the blank 104 contains at least a part of each of the carrier 101, the etch stop layer 102, and the solid layer. The part of the solid layer is present in the forms of the ribs that constitute the mesh.

The second last step in FIG. 7 illustrates attaching the blank to a radiation window frame 106. This steps illustrates another variation that can be combined with also other embodiments of methods for producing the blank. In the embodiments described earlier, the attachment of the blank to the radiation window frame was made on a side of the blank that does not have the carrier exposed. Correspondingly, the removing of at least a part of what of said carrier was contained in the blank comprised etching away essentially all of the exposed carrier up to the etch stop layer. In the embodiment shown in FIG. 7, the attachment of the blank to the radiation window frame 106 is made on a side of the blank that has the carrier exposed. The parts of the remaining carrier at the edges of the blank may be utilized in making the attachment, but also other ways of attaching are possible. The last step in FIG. 7 illustrates removing at least a part of what of the carrier was contained in the blank; here the removing comprises etching away essentially all of what is exposed of the carrier within an opening 105 defined by the radiation window frame 106, up to the etch stop layer.

Figure 8:
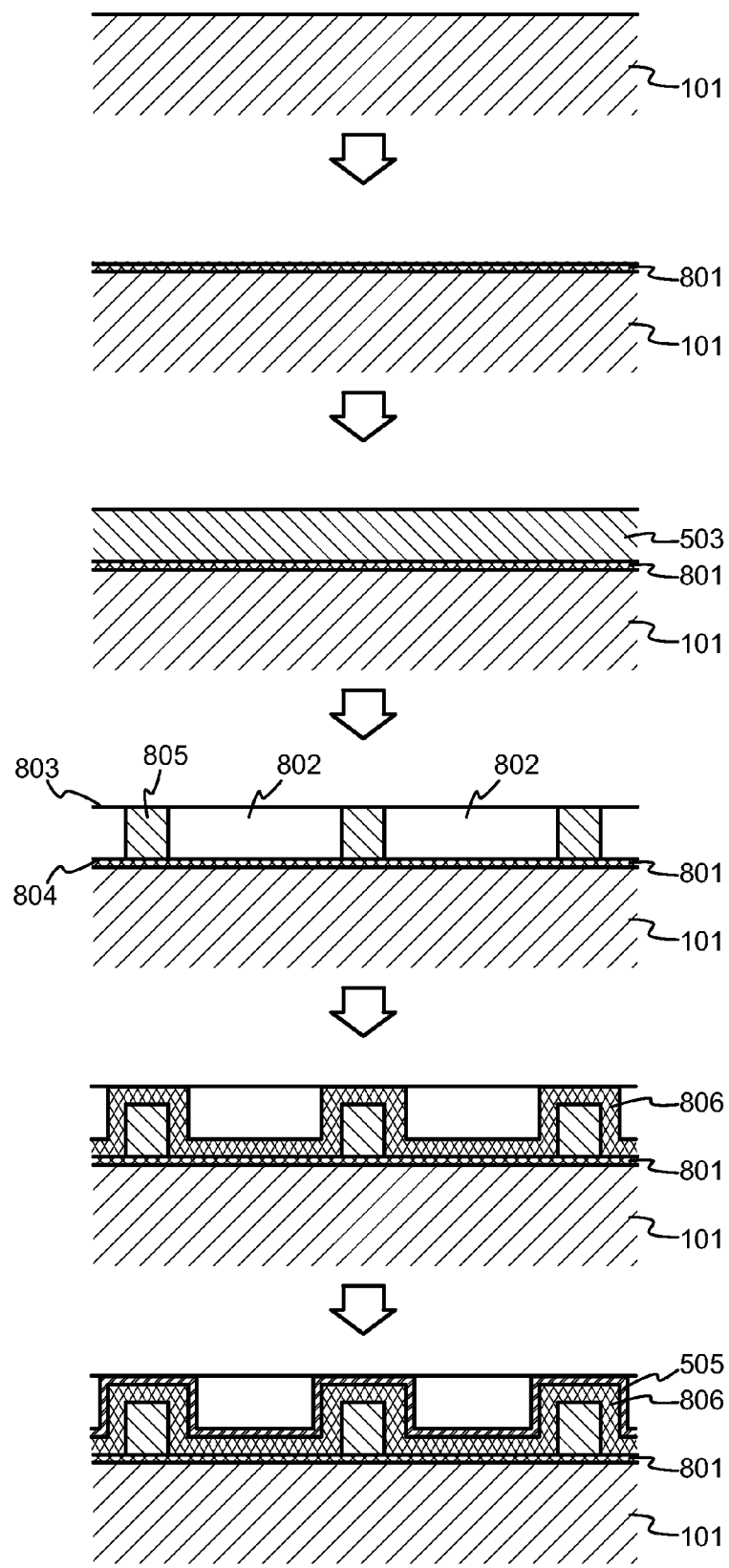
FIG. 8 illustrates another part of a method for manufacturing a radiation window.

FIG. 8 illustrates a variation from the theme that was introduced earlier in FIG. 5. In the topmost step of FIG. 8 a carrier 101 is provided, a surface of which has been polished and faces upwards in the drawing. The required smoothness of the surface is evaluated essentially by the same criterion as earlier, i.e. the aim of covering it with an essentially continuous etch stop layer. In the embodiment of FIG. 8 the etch stop layer that comes on said surface might be thinner than in some embodiments discussed earlier. At least in some cases that might mean that the surface of the carrier must be polished to a smoothness that is slightly better than what could be accepted in some other embodiments of the invention. However, as was pointed out earlier, for example silicon wafers are routinely polished to achieve rms roughness values in the order of fractions of a nanometer, which is still quite sufficient for the purposes of also the embodiment of FIG. 8.

Producing the etch stop layer 801 on the carrier is illustrated as the second step in FIG. 8. A different reference designator (801) is used here to underline that the etch stop layer 801 might be thinner than in some other embodiments. In the embodiment of FIG. 8 it does not necessarily have any other function than stopping an etching agent from propagating in a certain later processing step, which means that only a few nanometers (e.g. 5 nanometers) may be a sufficient thickness for the etch stop layer 801. No upper limit exists, but since all layers in a radiation window foil should be optimized for minimized unwanted attenuation of X-rays, the thinner the etch stop layer 801 the better, as long as it remains capable of fulfilling its etch stop function. A practically considered upper limit for the thickness of the etch stop layer 801 could be in the order of a few hundred nanometers. Silicon nitride is again a readily available candidate for the material of the etch stop layer 801, but other materials can be used as long as they are resistant enough against the method (like etching) that will be later used to detach the radiation window foil from the carrier 101.

The third step in FIG. 8 illustrates providing a solid layer 503 on the etch stop layer 801. Just like in the method of FIG. 5, at first the solid layer 503 is uniform. Also the criteria for selecting the material and thickness of the solid layer 503 are essentially the same as those listed earlier in association with the embodiment of FIG. 5. As an example, the thickness of the solid layer 503 (after possible thinning) could be between 3 and 20 micrometers. An example of materials that can be used to produce the solid layer 503 includes, but is not limited to, monocrystalline silicon. The material should have good tensile strength, relatively low attenuation of X-rays, and good adhesion to the etch stop layer 801. It should not exhibit X-ray fluorescence at awkward wavelengths that could overlap with particularly interesting X-ray fluorescence wavelengths to be measured. It is advantageous if the material of the solid layer 503 has thermal expansion characteristics that are close to those of the etch stop layer 801.

In the fourth step from above in FIG. 8, regularly or irregularly spaced portions of the originally uniform solid layer 503 are removed to turn said solid layer into a mesh that defines a number of openings. The characteristic dimensions of the mesh may include for example a diameter of openings in the order of 20 to 200 micrometers, and a width of the ribs in the mesh in the order of 5 to 20 micrometers. Assuming that the process of turning the originally uniform layer into a mesh does not significantly affect those parts of the layer that are to form the ribs, the height (the dimension in the vertical direction in FIG. 8) of the ribs constituting the mesh will be essentially the same as the thickness solid layer at the beginning of the mesh-making. These dimensions are examples only, and the eventual selection of characteristic dimensions should be made in accordance with the mechanical strength that the completed radiation window should have. Several methods for turning a previously uniform layer into a mesh layer are known, including but not being limited to photolithography, wet etching, dry etching, plasma etching, electron beam lithography, and ion beam lithography. The method should naturally be selected so that it still leaves the etch stop layer 801 continuous.

Together, the third and fourth steps in FIG. 8 constitute the so-called mesh-making step. As a result, there is seen in the fourth step of FIG. 8 a mesh that defines a number of openings 802. The mesh has a first side surface 803, and a second side surface 804 that is immediately against the etch stop layer 801. Thus the first side of the mesh is its upper side in FIG. 8, and the second side of the mesh is its lower side in FIG. 8. The mesh comprises ribs 805 that have tops directed towards the first side (i.e. upwards in FIG. 8) and bottoms directed towards the second side (i.e. downwards in FIG. 8) of the mesh. The tops of the ribs define the first side surface 803, and the bottoms of the ribs define the second side surface 804.

The next step in FIG. 8 illustrates an example of covering the mesh with a layer 806 on the first side of the mesh. Taken the orientation in FIG. 8. the layer 806 is thus added from above, by using a thin film deposition technique that produces an essentially continuous, essentially conformal layer. Sputtering and atomic layer deposition are examples of methods that can be used to produce the layer 806, but any method can be used that fulfils the requirements of producing an essentially continuous and conformal layer.

Examples of materials that can be used to produce the layer 806 include, but are not limited to, boron, boron nitride, beryllium, beryllium nitride, pyrolytic graphite, diamond-like carbon, aluminium, polymer, calcium, lithium carbonate, lithium nitride, lithium hydride, lithium boron oxide, lithium borate glass, and composite materials. The thickness of the layer 806 is typically less than one micrometer, but essentially more than the thickness of the etch stop layer 801. The embodiment of FIG. 8 aims at eventually producing a radiation window foil where the layer 806 will constitute a so-called actual window layer. This means that in each opening defined by the mesh, it is the layer 806 that carries a majority of the mechanical stress caused by the possible difference in pressure on different sides of the radiation window foil. This explains the difference in thickness between the etch stop layer 801 and the layer 806 in this embodiment: the latter may in some cases be more than hundred times thicker than the former.

The last step illustrated in FIG. 8 is optional and can be included if it is desirable to have one or more material layers 505 on top of layer 806 on the first side of the radiation window foil. Such material layers could be used to block visible light; to block some other undesired wavelengths of electromagnetic radiation; to enhance the corrosion resistance of the radiation window foil; to further decrease the diffusion of gaseous substances through the radiation window foil; to intentionally build into the radiation window foil the property of producing some desired fluorescence peaks; or for any other purpose.

The last step illustrated in FIG. 8 should be followed by a step of detaching the radiation window foil, which now comprises e.g. the mesh and the layer 806, from the carrier 101. The detaching step may comprise for example cutting the combined carrier and radiation window foil into blanks, attaching a blank to a radiation window frame, and etching away the carrier 101. The last-mentioned part explains the designation of the etch stop layer 801; it will keep the etching agent from propagating to the mesh, the layer 806, and the possible one or more material layers 505 on top of layer 806, while allowing the carrier to be etched away.

Figure 9:
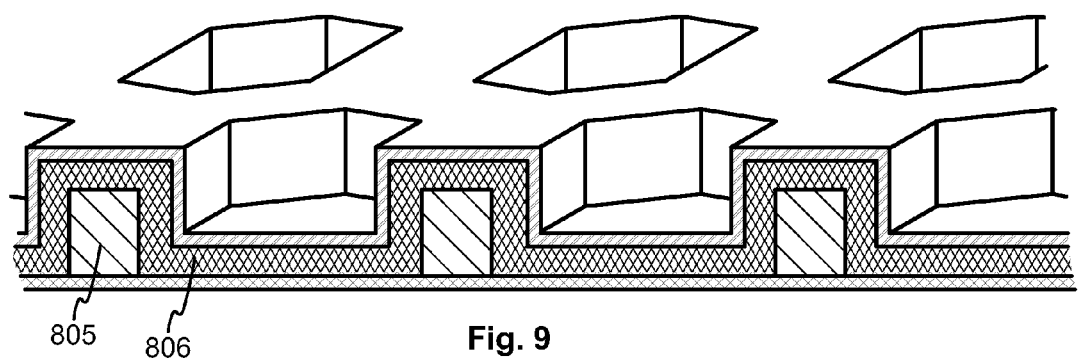
FIG. 9 illustrates a detail of a radiation window foil.

FIG. 9 is a partial cut-out representation of a radiation window foil manufactured with a method in accordance with FIG. 8. The radiation window foil comprises a mesh that defines a number of openings; here the openings are hexagonal in shape. Ribs 805 of the mesh are seen in the illustrated cross section. The mesh has a first side surface defined by the tops of the ribs 805, and a second side surface defined by the bottoms of the ribs 805. A layer 806 spans the openings in the mesh, however so that even if the layer 806 is on the first (top) side of the mesh, it spans the openings at a level that is closer to the second (bottom) side surface of the mesh than the first (top) side surface of the mesh. In the illustrated cross section the layer 806 is seen to meander around the ribs of the mesh, so that the layer 806 spans the openings at a level where it is flush with the bottoms of the ribs, and it climbs up the sides of the ribs to cover the tops of the ribs on the first (top) side of the mesh.

Figure 10:
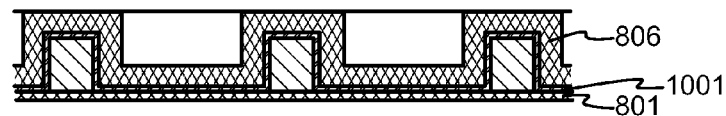
FIG. 10 illustrates a detail of another radiation window foil.

The layer 806 is not required to span the openings flush with the bottoms of the ribs. FIG. 10 illustrates an embodiment where the mesh was first covered with at least one further layer 1001, which in the completed radiation window foil exists between the layer 806 and the ribs of the mesh. Consequently layer 806 spans the openings at a level where the layer 806 is separated from the plane of the bottoms of the ribs by the thickness of said at least one further layer 1001. Remembering that the height of the ribs in the mesh may be several micrometers, and that thin layers like the further layer 1001 in a radiation window foil can have thicknesses in the order of nanometers, the layer 806 still spans the openings at a level closer to the second (bottom) side surface of the mesh than the first (top) side surface of the mesh.

Figure 11:
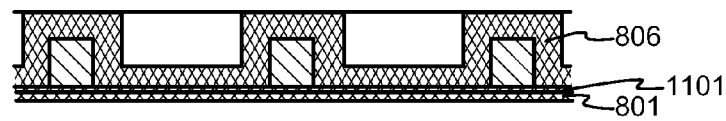
FIG. 11 illustrates a detail of another radiation window foil.

FIG. 11 illustrates an embodiment in which at least one further layer 1101 has been produced on the etch stop layer 801 before providing the solid layer from which the mesh was eventually produced. This is possible, but care should be taken in selecting the materials and processing parameters, in order not to loose the advantages that could be gained by producing the mesh directly on the etch stop layer. As an example, if the etch stop layer is made of silicon nitride and the mesh is made of monocrystalline silicon directly on top of it, very good adhesion can be achieved therebetween. It is also advantageous that the coefficients of thermal expansion are almost the same for silicon nitride and monocrystalline silicon.

In the embodiments of FIGS. 10 and 11 the at least one further layer 1001 or 1101 can be e.g. a diffusion barrier layer or -multilayer. Another purpose for at least one further layer 1001 or 1101 could be to act as a matching layer that matches the other layers better with each other, for example in terms of the structural parameters of crystallization. The principles illustrated in FIGS. 10 and 11 could be combined so that at least one further layer extends flat across the surface of the etch stop layer like layer 1101, and at least one yet further layer meanders around the ribs of the mesh like layer 1001. It is also possible to combine the use of at least one further "intermediate" layer (like any one of those illustrated as 1001 or 1101) with one or more material layers 505 on top of layer 806 on the first side of the radiation window foil (see FIG. 8).

Figure 12:
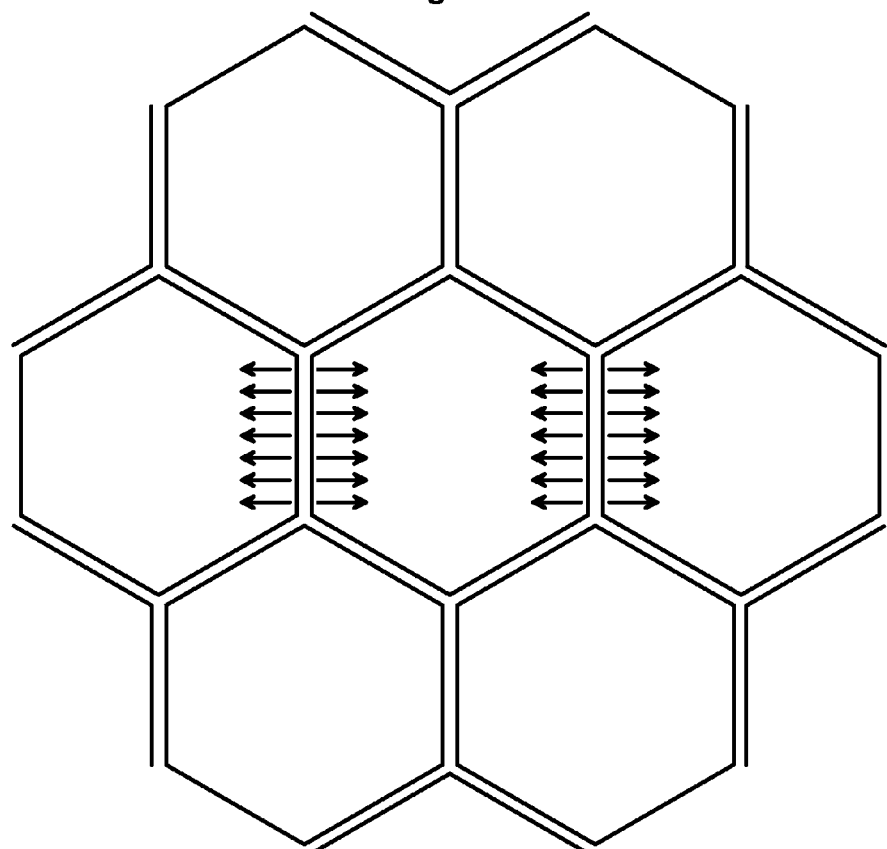
FIG. 12 illustrates the decoupling of forces in a radiation window foil.

Tests of a radiation window foil according to FIG. 9 have shown that it has good mechanical strength, as well as a truly exceptional endurance of high temperatures. FIG. 12 may offer some explanations to these advantageous properties. As an example, we may assume that the coefficient of thermal expansion of the mesh material (e.g. silicon) differs from that of the layer 806 material (e.g. beryllium). A change in temperature may cause the layer 806 to contract more than the mesh. This causes tensions in the structure. However, since the layer 806 is only flat across a relatively small opening, and meanders around the ribs of the mesh at all sides of said opening, the tensions occurring within one opening are effectively decoupled from those occurring in the adjacent openings. FIG. 12 has arrows to illustrate the mutually decoupled, opening-specific tensions in one direction.

This decoupling effect is a significant difference to all previously known radiation window foils where the major, load-bearing gastight layer is a continuous film that extends flat across the whole radiation window. If a reinforcing grid is only located on one side of such a continuous film, like on prior art radiation window foils, tensions in the film accumulate over large areas, easily leading to a mechanical failure of the radiation window foil. Prior art radiation window foils are known to have allowed temperature ranges of only some tens of degrees, while a radiation window like that of FIG. 9 with a beryllium layer meandering around a monocrystalline silicon mesh can stand well over 100 (one hundred) degrees centigrade. This is not believed to be a limiting temperature for the radiation window foil, but was more related to an epoxy compound used at another part of the radiation window structure. A foil with a silicon nitride (etch stop) layer and a silicon mesh is expected to stand at least about 1000 (one thousand) degrees centigrade.

The good mechanical strength can also be understood as a consequence of avoiding the concentration of mechanical loading to limited, line-like areas. If a prior art radiation window foil, where a continuous film extends across flat on top of grid, is loaded by pressure difference, the ribs of the grid act like knives that press into the continuous film, causing line-shaped local loading and often initiating mechanical failure. In a radiation window foil according to an embodiment of the present invention the load is distributed over a larger region within the parts where the layer 806 meanders around the ribs of the mesh.

It should be understood that an important part of the mechanical strength of radiation window foils according to embodiments of the invention stem from the structural solution, not from the selection of some particular materials. This opens the door to the use of materials and/or material thicknesses that have previously been considered unsuitable for radiation window foils because of their insufficient mechanical strength.

Figure 13:
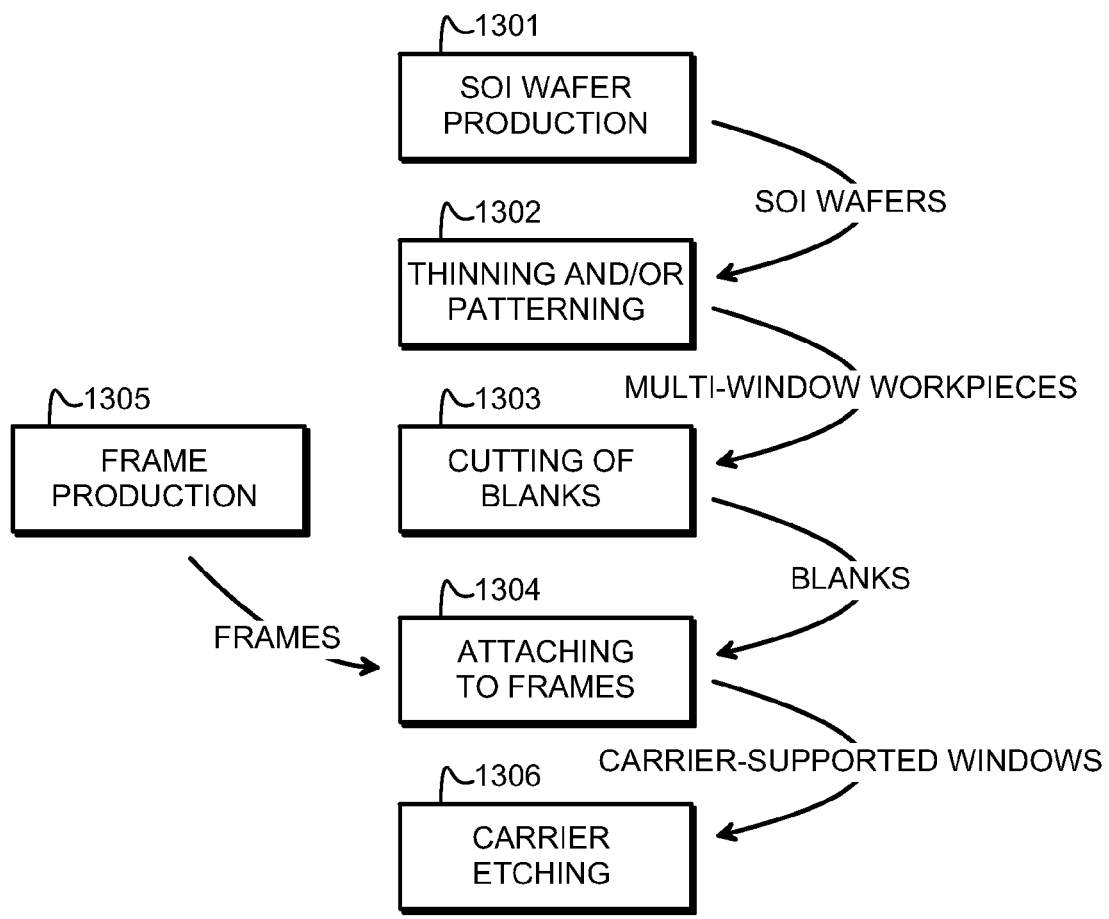
FIG. 13 illustrates an arrangement for manufacturing radiation windows.

FIG. 13 illustrates schematically an arrangement for manufacturing a radiation window. SOI wafers or corresponding layered structures where an etch stop layer exists between a carrier and a solid layer are manufactured in a subsystem 1301, where as a difference to e.g. patent applications number PCT/FI2010/050781 and PCT/FI2011/050100 the production of the layered structure comprises one of the following:

producing an etch stop layer on a solid carrier and bonding a solid layer on said etch stop layer;

producing an etch stop layer on a solid layer and bonding a solid carrier on said etch stop layer; or creating an etch stop layer inside a solid carrier, thus producing a layered structure where a solid layer exists on top of said etch stop layer.

Arrangements that may be used to fulfil the function of subsystem 1301 are known as such from the production of SOI wafers for manufacturing integrated circuits.

Subsystem 1302 comprises the grinding, etching, and/or polishing installations that are needed for thinning the solid layer into a desired thickness, and/or the photolithographic or other installations that are needed for patterning the solid layer with a predetermined pattern of differences in thickness. If the original SOI wafers were large enough, multiple radiation windows may be manufactured of any one of them, for which reason the output of subsystem 1302 may be called multi-window workpieces. A dicing saw or corresponding cutting installation is used as subsystem 1303 that is configured to cut out blanks and to feed them to subsystem 1304, which can be e.g. an automatic gluing machine configured to attach the blanks to radiation window frames. These come from e.g. a precision maching shop shown as subsystem 1305. The last subsystem shown in FIG. 13 is the carrier etching subsystem 1306, which is configured to take the otherwise completed radiation windows through an etching process that removes the unwanted parts of the carrier.

Advantages of the invention include the possibility of manufacturing radiation windows where the radiation window foil is very thin and yet gastight, and causes very little unwanted absorption or spurious responses in a measurement involving X-rays. Automatic gluing machines are known from the technology of manufacturing electronic components, and such machines can be adapted to perform the attaching of the cut-out pieces of (still carrier-supported) radiation window foil to their corresponding support structures. Thus the methods illustrated above can be automatized to a relatively high degree, which helps to ensure uniform quality and aesthetically pleasing appearance of the completed products.

We claim:

1. A method for manufacturing a radiation window, comprising, in the following order:
    producing an etch stop layer on a solid carrier, the etch stop layer being a material that is not affected by an etching agent that is used to remove the solid carrier in a later step,
    bonding a solid layer on said etch stop layer, thus producing a layered structure where said etch stop layer exists between said solid carrier and said solid layer,
    attaching a blank to a radiation window frame, said blank containing at least a part of each of said solid carrier, said etch stop layer, and said solid layer, and
    removing at least a part of said solid carrier that was contained in said blank with said etching agent, thus leaving a foil attached to said radiation window frame, wherein said foil contains at least a part of each of said etch stop layer and said solid layer.

2. A method according to claim 1, wherein said bonding of said solid layer on said etch stop layer is made using monocrystalline silicon as the material of said solid layer.

3. A method according to claim 1, further comprising, before attaching said blank to said radiation window frame, at least one of:
    thinning said solid layer into a predetermined thickness, and
    patterning said solid layer with a predetermined pattern of differences in thickness.

4. A method according to claim 1, further comprising, before attaching said blank to said radiation window frame:
    cutting out said blank from said layered structure.

5. A method according to claim 1, wherein said layered structure is a silicon-on-insulator wafer.

6. A method according to claim 1, wherein:
    the attachment of said blank to said radiation window frame is made on a side of the blank that does not have the solid carrier exposed, and
    said removing of at least a part of said solid carrier that was contained in the blank comprises the etching agent etching away essentially all of the exposed solid carrier up to the etch stop layer.

7. A method according to claim 1, wherein:
    the attachment of said blank to said radiation window frame is made on a side of the blank that has the solid carrier exposed, and
    said removing of at least a part of said solid carrier that was contained in the blank comprises the etching agent etching away essentially all of what is exposed of the solid carrier within an opening defined by said radiation window frame, up to the etch stop layer.

8. A method for manufacturing a radiation window, comprising, in the following order:
    producing an etch stop layer on a solid layer, the etch stop layer being a material that is not affected by an etching agent that is used to remove a solid carrier in a later step,
    bonding the solid carrier on said etch stop layer, thus producing a layered structure where said etch stop layer exists between said solid carrier and said solid layer,
    attaching a blank to a radiation window frame, said blank containing at least a part of each of said solid carrier, said etch stop layer, and said solid layer, and
    removing at least a part of said solid carrier that was contained in said blank, thus leaving a foil attached to said radiation window frame, wherein said foil contains at least a part of each of said etch stop layer and said solid layer.

9. A method according to claim 8, wherein said bonding of said solid layer on said etch stop layer is made using monocrystalline silicon as the material of said solid layer.

10. A method for manufacturing a radiation window, comprising, in the following order:
    creating an etch stop layer inside a solid carrier, thus producing a layered structure where a solid layer exists on top of said etch stop layer, the etch stop layer being a material that is not affected by an etching agent that is used to remove the solid carrier in a later step,
    attaching a blank to a radiation window frame, said blank containing at least a part of each of said solid carrier, said etch stop layer, and said solid layer, and
    removing at least a part of said solid carrier that was contained in said blank, thus leaving a foil attached to said radiation window frame, wherein said foil contains at least a part of each of said etch stop layer and said solid layer.

11. A method according to claim 10, wherein said creating of an etch stop layer inside a solid carrier is made using monocrystalline silicon as the material of said solid carrier.

12. A method according to claim 10, further comprising, before attaching said blank to said radiation window frame, at least one of:
    thinning said solid layer into a predetermined thickness, and
    patterning said solid layer with a predetermined pattern of differences in thickness.

13. A method according to claim 10, further comprising, before attaching said blank to said radiation window frame:
    cutting out said blank from said layered structure.

14. A method according to claim 10 wherein said layered structure is a silicon-on-insulator wafer.

15. A method according to claim 10, wherein:
    the attachment of said blank to said radiation window frame is made on a side of the blank that does not have the solid carrier exposed, and
    said removing of at least a part of said solid carrier that was contained in the blank comprises the etching agent etching away essentially all of the exposed solid carrier up to the etch stop layer.

* * * * *